Jan. 19, 1971 F. E. LUBORSKY 3,556,954

METHOD FOR OBTAINING CIRCUMFERENTIAL ORIENTATION OF MAGNETIC FILMS ELECTROPLATED ON WIRES

Filed July 29, 1968

Inventor:
Fred E. Luborsky,
by John J. Kissane
His Attorney.

3,556,954

METHOD FOR OBTAINING CIRCUMFERENTIAL ORIENTATION OF MAGNETIC FILMS ELECTROPLATED ON WIRES

Fred E. Luborsky, Schenectady, N.Y., assignor to General Electric Company, a corporation of New York Filed July 29, 1968, Ser. No. 748,507
Int. Cl. B01d 3/34
U.S. Cl. 204—28 7 Claims

ABSTRACT OF THE DISCLOSURE

A circumferential magnetic orientation is obtained in a nickel-iron magnetic film deposited upon a tungsten wire core successively plated with gold, copper and gold layers by revolving a linear magnetic field greater than 15 oersteds about the wire substrate during the plating of the nickel-iron film. The field is rotated at a speed greater than about one revolution per 10 A. layer of magnetic film deposited and, after deposition of the magnetic film to a thickness less than 15,000 A., the magnetic film plated wire is annealed at a temperature below 400° C. to decrease the dispersion of anisotropy of the film in the circumferential direction.

Figure 1:
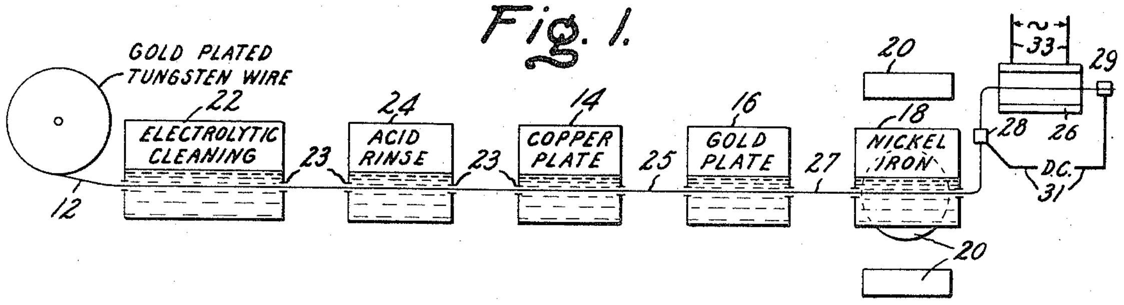

This invention relates to a method of plating a wire substrate with a magnetic film having an anisotropy favoring the orientation of the magnetization in a circumferential direction and, in particular, to the formation of a circumferentially orientated magnetic film by the rotation of a linear magnetic field greater than 15 oersteds about the axial plane of the wire substrate during the electrodeposition of the magnetic film upon the substrate.

Plated wires suitable for memory devices heretofore have been formed by passing a current through a wire substrate during plating of the magnetic film thereon to produce a circumferential magnetic field about the wire orienting the deposited film in a circumferential direction. Current flow through the wire substrate during plating however tends to produce a nonlinear temperature distribution along the substrate length, e.g. the portions of the substrate proximate to the entrance and exit of the substrate from the agitated plating bath generally are characterized by a higher temperature than the portion of the substrate at the bath center, resulting in a nonuniform composition in the magnetic film plated out along the length of the bath. Similarly a nonuniform composition in the plated magnetic film tends to be produced by voltage gradients along the wire length due to resistance losses in the substrate. The requirement for current flow in the wire substrate during plating also inhibits the utilization of a very small diameter wire, e.g. substrates less than approximately 5 mils, due to the substantial resistance offered to current flow during plating.

It is therefore an object of this invention to provide a novel method of forming a highly uniform magnetic film having a circumferential magnetic orientation upon a wire substrate.

It is also an object of this invention to provide a method of forming a circumferentially oriented magnetic film plated wire independently of current flow through the wire substrate during film plating.

These and other objects of this invention generally are achieved by the electrolytic deposition of a magnetic film of a thickness less than 15,000 A. upon a conductive substrate in the presence of a linear magnetic field rotated about the axis of the substrate. Thus a plurality of coils are positioned about the magnetic film deposition bath in a circumferential attitude relative to the axial direction of the substrate within the bath and the coils are energized to produce a magnetic field strength greater than approximately 15 oersteds at the substrate surface. The magnetic field then is rotated about the substrate axis, e.g. by the application of phase displaced signals to radially disposed coils, to produce a circumferential orientation in the deposited film. Preferably the magnetic field is rotated at a speed of at least one revolution per 10 A. film deposited upon the substrate and the film is subsequently annealed to decrease the dispersion of the anisotropy in a circumferential direction.

Figure 2:
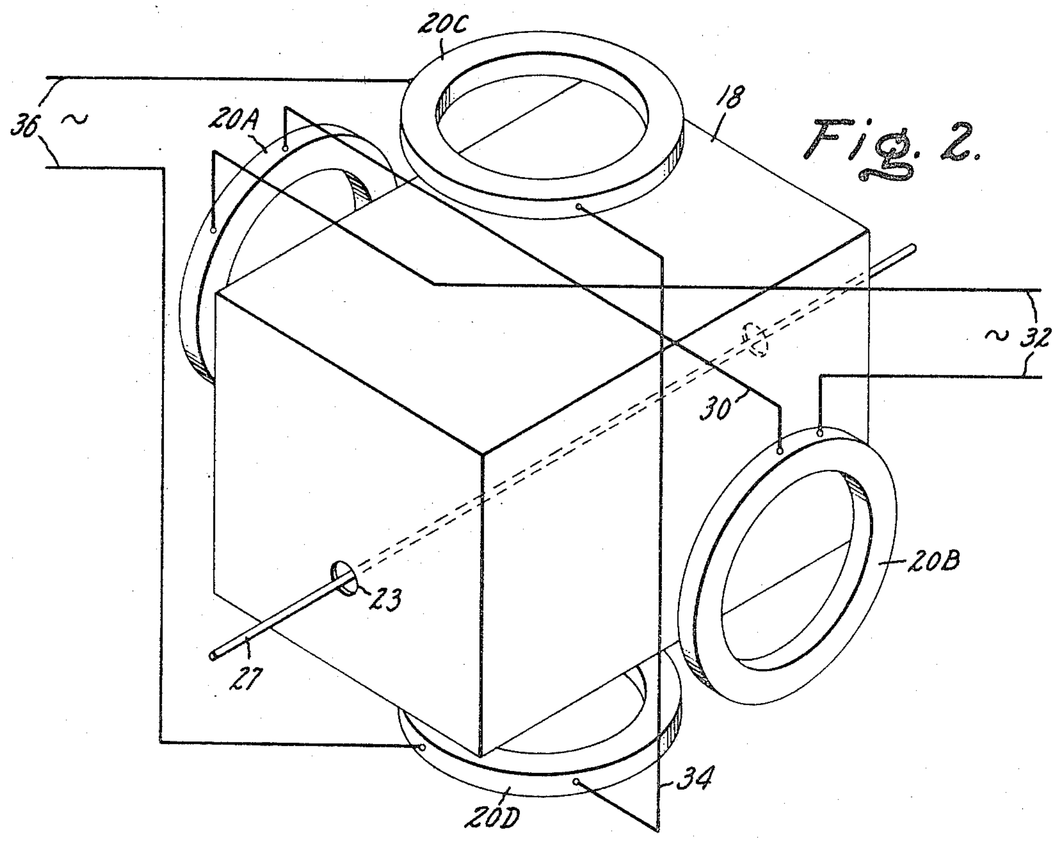
Figure 4:
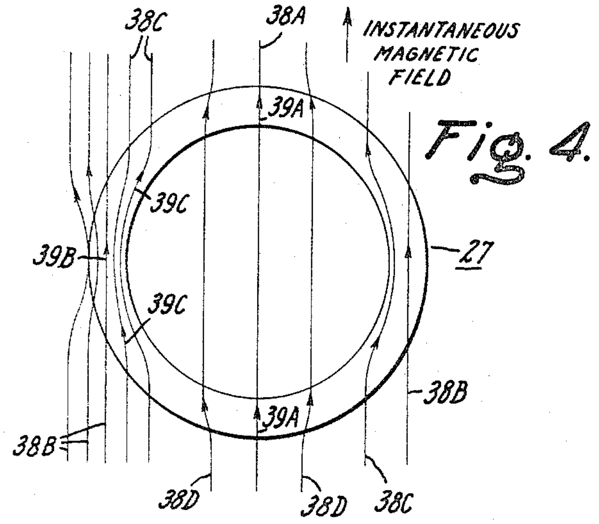
Figure 3:
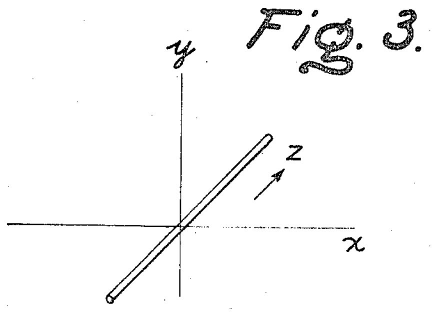

The novel features believed characteristic of the invention are set forth in the appended claims. The invention itself, together with further objects and advantages thereof may best be understood by reference to the following description, taken in connection with the accompanying drawings, in which:

FIG. 1 is a pictorial illustration of the method of forming a circumferentially disposed magnetic film upon a conductive substrate in accordance with this invention, FIG. 2 is an enlarged isometric view of the magnetic film plating cell utilized in this invention, FIG. 3 is a graphic illustration of the conductive substrate during deposition of the magnetic film thereon, and, FIG. 4 is an enlarged sectional view of the plated wire in the magnetic film deposition bath.

The method of forming the circumferentially oriented magnetic film coated wire of this invention is depicted in FIG. 1 and basically comprises the successive passage of a cleaned gold plated tungsten wire substrate 12 through copper and gold plating baths, identified by reference numerals 14 and 16 respectively, to provide a smooth, fine grain, surface for the deposition of a nickel-iron alloy magnetic film in bath 18. The desired circumferential orientation in the deposited nickel-iron alloy film is produced externally of the nickel-iron bath by a rotating linear magnetic field generated by a plurality of field coils 20 circumferentially disposed about the axial plane of the wire substrate in the nickel-iron bath. The plated substrate then is annealed in a furnace 26 to improve the coercive force, dispersion, anisotropy and stability upon aging, of the magnetic film.

Gold clad tungsten substrate 12 generally comprises a tungsten core drawn and electropolished to approximately 2 mil diameter plated with approximately 6–7% by weight gold, e.g. approximately 9,000 A. While techniques for plating gold onto tungsten are known, e.g. such techniques are described in copending R. O. McCary and F. E. Luborsky application 658,942, filed Aug. 7, 1967, and assigned to the assignee of this present invention (which application is incorporated herein by reference to illustrate other preferred substrates and magnetic film compositions for deposition in accordance with this invention), gold clad tungsten wire can be purchased from the Lamp Division of the General Electric Company under the serial number KR2022–T21L3. Because high conductivity is not required during the magnetic film plating in accordance with this invention, the tungsten core of gold clad tungsten substrate 12 generally is smaller than 5 mils in diameter to maximize the density and reduce the drive currents of a plated wire memory device constructed therewith. In general, the total diameter of the magnetic film plated wires fabricated by the method of this invention is less than 10 mils.

The outer surface of gold clad tungsten substrate 12 is electrolytically cleaned by passing the substrate into a tank 22 containing a suitable solvent for relatively inactive metals, e.g. a solution of 17 grams per liter $Na_2CO_3$, 13 grams per liter $Na_3PO_4 \cdot 12H_2O$, 7 grams per liter NaOH and 0.4 gram per liter sodium lauryl sulfate. A gold clad substrate 12 traveling at a rate of 10 inches per minute through the solvent was adequately cleaned utilizing a current density of 30 milliamps per square centimeter with the solvent maintained at a temperature of 65° C. and pumped at a rate of 0.2 liter per minute. Although active metal anodes can be employed, inactive platinum anodes preferably are utilized to apply a positive potential to all the electrolytic baths of FIG. 1.

Access to each bath is achieved by passing the wire substrate through apertures 23 within the bath sidewalls of a diameter slightly greater than the substrate e.g. an 8 mil diameter aperture generally permits the passage of a 2 mil diameter substrate without excessive leakage from the baths. Thus rollers are not required in the baths and the entire surface of the substrate is uniformly contacted by the baths. Although not illustrated for purposes of clarity, rinsing stations of tap and distilled water are positioned between each bath to inhibit contamination of the baths by residual electrolytic fluids clinging to the substrate surface from the prior bath.

After cleaning of the surface of substrate 12 in the solvent and rinsing, the substrate is fed through an acid rinse tank 24 containing 10% HCl in distilled water to prepare the substrate for the subsequent acidic electrolytic depositions. Preferably the acid rinse is maintained at room temperature and is agitated by pumping the fluid through the cell at a rate of 0.2 liter per minute to assure a complete rinsing of the substrate passing therethrough.

Upon completion of the acid rinse, the gold plated substrate is rinsed in water and drawn through copper plating bath 14 which bath may suitably contain 225 grams per liter $CuSO_4 \cdot 5H_2O$, 0.05 gram per liter thiourea, 0.5 gram per liter acid napthol-2-sulfonic-6 and sufficient $H_2SO_4$ to bring the pH of the bath of 0.7. Preferably, the copper plate bath is maintained at a temperature of 20° C. and is agitated by pumping the electrolyte through the cell at a rate of 2.5 liters per minute. Utilizing a current density of 900 milliamps per square centimeter during deposition, a copper layer approximately 0.12 mil thick is plated upon the gold coated substrate to increase the conductivity of the substrate and produce a further smoothing of the substrate surface preparatory to the magnetic film deposition.

The copper clad substrate 25 then is rinsed and fed to gold plating bath 16 wherein a strike layer of gold is plated upon the copper clad wire passing therethrough. A suitable gold plating solution for this purpose is Orosene 999, a proprietary product of Technic Incorporated, Providence, R.I., maintained at a temperature of 25° C. and pumped through the cell at a rate of 0.4 liter per minute. A current density of approximately 30 milliamperes per square centimeter is advantageously employed to plate the wire traveling at a rate of ten inches per minute through the solution to produce a gold strike layer approximately 1,100 A. thick.

After rinsing, the gold plated wire 27 is fed to nickel-iron alloy bath 18 for the deposition of a magnetic film having a composition suitable for the desired utility of the plated wire. In general, nickel-iron alloy films, e.g. nickel-iron films or nickel-iron films containing a small quantity of cobalt, exhibit characteristics most desirable for plated wire memory applications. One suitable solution for depositing a nickel-iron magnetic film atop the wire substrate within the bath comprises a solution of 98.7 grams per liter $FeSO_4 \cdot 7H_2O$, 433 grams per liter $NiSO_4 \cdot 6H_2O$, 25 grams per liter $H_3BO_3$, 0.25 gram per liter sodium lauryl sulfate, 0.25 gram per liter thiourea, and sufficient $H_2SO_4$ to bring the pH of the solution to 2. When small quantities of cobalt are desired in the film, a soluble cobalt salt, e.g. $CoSO_4 \cdot 7H_2O$, can be added to the solution. The temperature of the bath preferably is maintained at 50° C. and the bath is agitated during deposition at a suitable rate, e.g. by pumping through the plating cell at 2 liters per minute, to obtain a uniformity in the deposited film. Utilizing a current density of 50 milliamps per square centimeter, a 1,000 A. thick nickel-iron film having zero magnetostriction is deposited upon the wire. In general, the magnetic film is deposited to a thickness less than 15,000 A. in forming plated wires for magnetic memory devices.

Because zero magnetostriction is required in the deposited film, the desirable current for deposition of the nickel-iron film can be determined empirically by depositing the film at various currents upon wire substrates and then changing the tension on the wire passing through the test fixture by a fixed amount, e.g. 40 grams. The current density producing identical circumferential coercive forces, both with and without the change in tension, then is employed during plating to produce zero magnetostriction films.

The circumferential orientation in the deposited magnetic film is obtained utilizing a generally linear magnetic field produced by field coils 20 circumferentially disposed about the axis of the gold clad substrate 27 within nickel-iron bath 18 and energized by an A.C. source, e.g. 90° phase displaced 60 cycle sine wave sources identified by reference numerals 32 and 36 in FIG. 2, to produce a rotation of the linear field about the axis of the substrate during plating. Thus, with the axial direction of the gold plated substrate within bath 18 lying in the direction depicted in FIG. 3, e.g. in a $z$ direction, coils 20A and 20B disposed along the $x$ axis on diametrically opposite sides of the wire substrate are serially joined by external conductor 30 and energized by one-phase 32 of the two-phase A.C. source while coils 20C and 20D disposed along the $y$ axis on diametrically opposite sides of the wire substrate are serially connected by external conductor 34 and energized by the other phase 36 of the two-phase A.C. source. The linear field produced by coils 20 then is rotated by the 90° phase displaced sinusoidal energization of the coils about the axis of the wire substrate during plating at the frequency of the energizing A.C. source. In general, a 60-cycle frequency is most conveniently obtained and generally can be employed for magnetic film plating at conventional speeds although higher frequency A.C. fields may advantageously be used. To assure a circumferential orientation in the deposited film, however, the magnetic field strength of the coils preferably should exceed 15 oersteds at the surface of the wire substrate and the field should be rotated at a frequency of at least one revolution per 10 A. layer of magnetic film deposited upon the substrate. Magnetic field strengths in excess of 15 oersteds at the wire substrate surface have been formed by four 90° displaced circumferentially disposed field coils having 500 turns wound in a diameter of approximately 7 inches and energized by a 208 volt source when positioned approximately 3½ inches from wire substrate 27. It is to be realized that the linear rotating field employed in magnetic film deposition in acordance with this invention can be produced by other coil geometries relative to the substrate axis, e.g. by three coils spaced 120° apart about the coil axis and individually energized by a single phase of a three phase source. Similarly, axial rotation of a linear magnetic field about the wire substrate during deposition of the magnetic film thereon can be obtained by techniques other than the application of phase displaced A.C. signal to circumferentially disposed electromagnetic coils, e.g. by the rotation of permanent magnets about the periphery of the wire substrate utilizing mechanical techniques.

As can be seen from the enlarged sectional view of FIG. 4 depicting the instantaneous application of the linear magnetic field to the magnetic film during deposition within bath 18, the magnetic field lines passing through the center of the wire, e.g. field lines 38A, tend to produce an undesirable orientation of magnetization 39A along the hard axis, i.e., in a radial direction, while magnetic field lines 38B passing generally tangential to the nickel-iron magnetic film tend to orient the magnetization 39B in the desired cricumferential orientation. Those field lines 38C immediately adjacent to the generally tangential field lines 38B are attracted by the low magnetic permeability of the nickel-iron coating to traverse a path in a generally circumferential direction in passing from one side of the wire to the other thereby tending to circumferentially align a substantial portion of the magnetization 39C in the nickel-iron film through which lines 38C pass. Similarly in the portion of the nickel-iron film lying between the area through which the magnetic field lines pass in a circumferential direction and the area through which field lines 38A pass in a tangential direction, the applied field 38D is canted slightly passing through the nickel-iron film and is characterized by both a radial and a tangential direction to provide some assistance in producing a circumferential orientation is the deposited magnetic film. Thus at every instance in time, a substantially larger portion of the deposited magnetic film is circumferentially aligned relative to the portion of the film radially aligned due to curvature in the flux lines traversing the low permeability nickel-iron film path. By rapidly rotating the linear field about the axis of the wire during the film deposition, no single area of the magnetic film is aligned in a radial direction for a prolonged period and the cumulative effect of the rotating linear field is an alignment of the average anisotropy in a circumferential direction.

The advantageous effect of the linear rotating magnetic field about the wire substrate during the plating of the magnetic film thereon is exemplified by a measurement of the circumferential coercive force of an 890 A. thick nickel-iron film deposited in acordance with the method of FIG. 1 utilizing a 33 oersted field produced by coils 20 and rotated at a speed of 60 cycles per second. The coercive force of the magnetic film deposited in the linear rotating field measured 4.4 oersteds in a circumferential direction while a second nickel-iron film formed in the identical manner employing an axially disposed magnetic field of 25 oersteds exhibited a coercive force in a circumferential direction of 3.2 oersteds, e.g. a 27% decrease in circumerfential coercive force relative to magnetic films formed using a rotating linear field. To maximize the circumferentially orienting magnetic field, coils 20 desirably are of an area to generate a magnetic field extending beyond the outer periphery of the wire substrate in the plating bath, e.g. the magnetic field minimally should be uniform over a cylindrical plane having a height approximately equal to the length of the wire substrate in bath 18 and a diameter at least equal to twice the wire substrate diameter.

A further decrease in the circumferential dispersion of anisotropy of the deposited magnetic film can be obtained by annealing the deposited film in an electrically energized furnace 26 through which the plated film is drawn after deposition. After the deposition of the magnetic film in bath 18, plated wire 19 is fed to furnace 26 electrically energized by source 33 to anneal the wire at a temperature below 400° C. for an economically reasonable period, e.g. preferably less than 5 minutes. During the annealing, current from D.C. source 31, e.g. approximately 350 ma. for a 2.5 mil wire, is passed through the portion of the magnetic film plated wire in the furnace utilizing mercury contacts 28 and 29 and a magnetic field is generated comparable to the magnetic field employed during magnetic film deposition, e.g. greater than 15 oersteds in a circumferential direction. Because the beneficial effects of the annealing are not critically sensitive to voltage along the length of the wire in the furnace, the voltage gradient produced by the magnetic field generating current flow through the wire during the anneal does not adversely affect the anneal. In general, an increase of approximately 5 to 10% in the circumferential coercive force, which is indicative of the increase in anisotropy, is obtained by a subsequent anneal of the film along with the conventional stabilization of the magnetic film properties upon aging. The dispersion of the magnetic film also is reduced by the anneal with reductions of a higher percentage, e.g. 50 to 150%, generally being achievable while the circumferential anisotropy of the film can be increased from 20 to 50 percent by annealing the wire.

The maximum annealing temperature employed generally is limited, for a given anneal time, by diffusion between the specific substrate metal and the permalloy, or by crystal growth or recrystallization of the films, with temperatures not exceeding 400° C. generally being permissable for plated wire formed by the method of FIG. 1. Thus the anneal period is beneficially the maximum period economically permissable provided deleterious diffusion or recrystallization does not occur and anneals at 220° C. for 16 seconds generally have been found to adequately improve the magnetic properties, e.g. anisotropy, circumferential coercive force and dispersion, of nickel-iron plated wire. The annealing of the wire to improve the magnetic properties after the deposition of the film in the externally applied rotating field also provides the stabilization treatment commonly employed with conventionally deposited magnetic films.

The beneficial effect produced by the subsequent anneal was illustrated utilizing nickel-iron films deposited upon planar substrates identical in composition to the magnetic film substrate of FIG. 1. In two samples, a linear magnetic field greater than 15 oersteds was rotated about the plane of the magnetic film utilizing the rotating field technique of FIG. 1 while in two other samples a D.C. field was applied parallel to the plane of the magnetic film. Measurement of the magnetic properties of the samples indicated all the samples to have an approximately equal coercive force with the films formed in the rotating field exhibiting an approximately 18% higher dispersion than the films formed in the parallelly applied field. All samples then were annealed for one hour at 150° C. in air with an applied 1,000 oersted field in an easy axis direction. Subsequent measurement of the dispersion of the films indicated an increase of 1% and 5% in the dispersion of the two samples deposited in the D.C. parallelly applied magnetic field while decreases of 14% and 31% were exhibited in the dispersion of the two samples deposited in the rotating magnetic field. No noticeable change in the coercive forces of all the magnetic films was observed as a result of the anneal.

While the invention has been described with respect to certain specific embodiments, it will be appreciated that many modifications and changes may be made without departing from the spirit of the invention. I intend, therefore, by the appended claims, to cover all such modifications and changes as fall within the true spirit and scope of my invention.

What I claim as new and desire to secure by Letters Patent of the United States is:

1. In a method for depositing a magnetic film having an anisotropy favoring the orientation of the magnetization in a circumferential direction by the electrolytic deposition of a magnetic metal of a thickness less than 15,000 A. upon a conductive substrate in the presence of a magnetic field, the improvement comprising the formation of said magnetic field by positioning a plurality of coils about the magnetic film bath in a circumferential attitude relative to the axial direction of said substrate in said bath, energizing said coils to produce a magnetic field strength greater than 15 oersteds at the surface of said substrate and rotating said magnetic field about the axis of said substrate during the magnetic film deposition to produce a circumferential orientation of the magnetization in said deposited film.

2. A method for depositing a magnetic film according to claim 1 wherein said magnetic field is rotated at a speed of at least one revolution per 10 A. layer of magnetic film deposited atop said substrate.

3. A method for depositing a magnetic film according to claim 1 including annealing said magnetic film at a temperature below 400° C. to increase the coercive force of said film.

4. A method of forming a nickel-iron wire film having a circumferential magnetic orientation comprising electrolytically cleaning the surface of a gold coated tungsten wire substrate, plating a copper layer atop said substrate, depositing a gold strike layer upon said copper layer, passing said plated substrate into a nickel-iron alloy plating bath, generating an external linear magnetic field perpendicular to the axial direction of said wire substrate within said nickel-iron alloy plating bath to produce a magnetic field strength greater than 15 oersteds at the surface of said substrate and rotating said magnetic field about said substrate at a speed of at least one revolution per 10 A. layer of magnetic film deposited atop said substrate to produce a circumferential magnetic orientation in said deposited film.

5. A method of forming a nickel-iron wire film having a circumferential orientation according to claim 4 further including annealing said magnetic film at a temperature less than 400° C. to increase the coercive force of said deposited magnetic film.

6. A method of forming a magnetic film having a circumferential magnetic orientation upon a conductive wire substrate comprising positioning the wire substrate within an electrolytic bath for the deposition of a magnetic film thereon, generating a linear magnetic field at a perpendicular attitude relative to the axial direction of said wire substrate within said bath, said generated magnetic field being uniform over a distance at least twice the diameter of said wire substrate and producing a magnetic field strength greater than 15 oersteds at the surface of said substrate, rotating said magnetic field in a circumferential direction about the axis of said substrate, plating said magnetic film upon said substrate during rotation of said linear magnetic field and subsequently annealing said magnetic film plated wire substrate.

7. A method for depositing a magnetic film according to claim 6 wherein said magnetic field is rotated at a speed of at least one revolution per 10 A. layer of magnetic film deposited atop said substrate.

References Cited

UNITED STATES PATENTS

| | | | |
|---|---|---|---|
| 2,763,204 | 9/1956 | Sims | 101—119 |
| 3,065,105 | 11/1962 | Pohm | 117—93 |
| 3,441,494 | 4/1969 | Oshima | 204—228 |

DANIEL E. WYMAN, Primary Examiner

P. H. FRENCH, Assistant Examiner

U.S. Cl. X.R.

204—43; 340—174